US010174226B2

(12) United States Patent
Nakako et al.

(10) Patent No.: US 10,174,226 B2
(45) Date of Patent: Jan. 8, 2019

(54) ADHESIVE COMPOSITION AND SEMICONDUCTOR DEVICE USING SAME

(71) Applicant: HITACHI CHEMICAL COMPANY, LTD., Tokyo (JP)

(72) Inventors: Hideo Nakako, Tsukuba (JP); Toshiaki Tanaka, Tsukuba (JP); Michiko Natori, Tsukuba (JP); Dai Ishikawa, Tsukuba (JP); Hiroshi Matsumoto, Tsukuba (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 14/407,579

(22) PCT Filed: Jun. 14, 2013

(86) PCT No.: PCT/JP2013/066516
§ 371 (c)(1),
(2) Date: Dec. 12, 2014

(87) PCT Pub. No.: WO2013/187518
PCT Pub. Date: Dec. 19, 2013

(65) Prior Publication Data
US 2015/0137347 A1  May 21, 2015

(30) Foreign Application Priority Data

Jun. 14, 2012  (JP) .................................. 2012-135231

(51) Int. Cl.
*C09J 11/04* (2006.01)
*H01L 23/495* (2006.01)
(Continued)

(52) U.S. Cl.
CPC .................. *C09J 11/04* (2013.01); *C08K 3/08* (2013.01); *C09J 1/00* (2013.01); *C09J 9/02* (2013.01);
(Continued)

(58) Field of Classification Search
USPC ....... 257/734; 252/71, 73, 79; 428/551, 554, 428/557, 560, 620
See application file for complete search history.

(56) References Cited

U.S. PATENT DOCUMENTS

2008/0115861 A1* 5/2008 Ishiga .................. B23K 35/262
                                                      148/23
2009/0137771 A1* 5/2009 Moriyama ........... A61K 6/0023
                                                      528/380
(Continued)

FOREIGN PATENT DOCUMENTS

CN          1340584 A    3/2002
JP          5-81923 A    4/1993
(Continued)

OTHER PUBLICATIONS

International Preliminary Report of Appln. No. PCT/JP2013/066516 dated Dec. 24, 2014 in English.
(Continued)

*Primary Examiner* — Moazzam Hossain
*Assistant Examiner* — Lawrence Tynes, Jr.
(74) *Attorney, Agent, or Firm* — Fitch, Even, Tabin & Flannery, LLP

(57) ABSTRACT

An adhesive composition comprising silver particles containing silver atoms and zinc particles containing metallic zinc, wherein the silver atom content is 90 mass % or greater and the zinc atom content is from 0.01 mass % to 0.6 mass %, with respect to the total transition metal atoms in the solid portion of the adhesive composition.

20 Claims, 10 Drawing Sheets

(51) Int. Cl.
*C09J 1/00* (2006.01)
*H01L 23/00* (2006.01)
*C08K 3/08* (2006.01)
*C09J 9/02* (2006.01)
*H01B 1/22* (2006.01)
*C08K 7/00* (2006.01)

(52) U.S. Cl.
CPC ......... *H01B 1/22* (2013.01); *H01L 23/49579* (2013.01); *H01L 24/29* (2013.01); *C08K 7/00* (2013.01); *C08K 2003/0806* (2013.01); *C08K 2003/0893* (2013.01); *C08K 2201/001* (2013.01); *H01L 24/32* (2013.01); *H01L 24/48* (2013.01); *H01L 24/73* (2013.01); *H01L 24/83* (2013.01); *H01L 2224/2929* (2013.01); *H01L 2224/29318* (2013.01); *H01L 2224/29339* (2013.01); *H01L 2224/29499* (2013.01); *H01L 2224/32225* (2013.01); *H01L 2224/32245* (2013.01); *H01L 2224/48091* (2013.01); *H01L 2224/48247* (2013.01); *H01L 2224/73265* (2013.01); *H01L 2224/83203* (2013.01); *H01L 2224/83862* (2013.01); *H01L 2224/92247* (2013.01); *H01L 2924/00014* (2013.01); *H01L 2924/10253* (2013.01); *H01L 2924/12032* (2013.01); *H01L 2924/12041* (2013.01); *H01L 2924/12042* (2013.01); *H01L 2924/1301* (2013.01); *H01L 2924/13055* (2013.01); *H01L 2924/13091* (2013.01); *H01L 2924/15747* (2013.01); *H01L 2924/15788* (2013.01); *H01L 2924/181* (2013.01)

(56) References Cited

U.S. PATENT DOCUMENTS

| | | | |
|---|---|---|---|
| 2009/0166584 A1* | 7/2009 | Shimooka | C09K 11/0883 252/301.4 F |
| 2011/0291249 A1* | 12/2011 | Chi | H01L 21/4832 257/675 |
| 2012/0174978 A1* | 7/2012 | Ionkin | H01B 1/22 136/256 |

FOREIGN PATENT DOCUMENTS

| | | |
|---|---|---|
| JP | 6-329960 A | 11/1994 |
| JP | 6-336562 A | 12/1994 |
| JP | 11-66953 A | 3/1999 |
| JP | 2002-150838 A | 5/2002 |
| JP | 2004-111253 A | 4/2004 |
| JP | 2004-111254 A | 4/2004 |
| JP | 2005-93996 A | 4/2005 |
| JP | 2006-73811 A | 3/2006 |
| JP | 2006-83377 A | 3/2006 |
| JP | 2006-302834 A | 11/2006 |
| JP | 4353380 B2 | 10/2009 |
| JP | 2012-67155 A | 4/2012 |
| WO | 2011/035015 A1 | 3/2011 |
| WO | 2013/094543 A1 | 6/2013 |

OTHER PUBLICATIONS

CN Office Action of Appln. No. 201380031406 dated Jul. 21, 2015.
Office Action in counterpart CN Patent Application No. 201380031406.X dated Apr. 27, 2016.

* cited by examiner

ADHESIVE COMPOSITION AND SEMICONDUCTOR DEVICE USING SAME

TECHNICAL FIELD

The present invention relates to an adhesive composition and to a semiconductor device using it. More specifically, it relates to an adhesive composition suitable for adhesion of semiconductor elements such as power semiconductors, LSIs or light emitting diodes (LED) onto substrates such as lead frames, ceramic wiring boards, glass epoxy wiring boards and polyimide wiring boards, as well as a semiconductor device using it.

BACKGROUND ART

Methods of bonding semiconductor elements and lead frames (supporting members) during production of semiconductor devices include methods wherein a filler such as silver powder is dispersed in a resin such as an epoxy-based resin or polyimide-based resin to form a paste (for example, silver paste), which is used as a bonding agent. In this method, a dispenser, printer, stamping machine or the like is used to coat the adhesive paste onto the die pad of a lead frame, and then the semiconductor element is subjected to die bonding and heat cured for bonding to produce a semiconductor device.

With increasing speeds and higher integration of semiconductor elements in recent years, there has been demand for high heat dissipating properties to ensure operating stability for semiconductor devices.

As means for achieving higher heat dissipation than with conventional conductive adhesives having contact between metallic particles, there have been proposed adhesive compositions in which silver particles with high thermal conductivity are filled to a high degree (Patent Literatures 1 to 3), an adhesive composition using solder particles (Patent Literature 4), and an adhesive composition using highly sinterable metal nanoparticles with mean particle diameters of no greater than 0.1 µm (Patent Literature 5).

In addition, there has been proposed an adhesive composition employing special surface-treated microsize silver particles, having thermal conductivity and high-temperature connection reliability superior to these compositions, whereby the silver particles become sintered together by heating at from 100° C. to 400° C. (Patent Literature 6). In the adhesive composition proposed in Patent Literature 6 where silver particles are sintered together, presumably the superior thermal conductivity and high-temperature connection reliability compared to other methods is due to formation of metal bonding by the silver particles.

CITATION LIST

Patent Literature

[Patent Literature 1] Japanese Unexamined Patent Application Publication No. 2006-73811
[Patent Literature 2] Japanese Unexamined Patent Application Publication No. 2006-302834
[Patent Literature 3] Japanese Unexamined Patent Application Publication No. 11-66953
[Patent Literature 4] Japanese Unexamined Patent Application Publication No. 2005=93996
[Patent Literature 5] Japanese Unexamined Patent Application Publication No. 2006=83377
[Patent Literature 6] Japanese Patent Publication No, 4353380

SUMMARY OF INVENTION

Technical Problem

Incidentally, gold is provided on semiconductor element adherend surfaces by plating, sputtering or the like from the viewpoint of rust prevention. This can facilitate performance testing before mounting of semiconductor elements, and can minimize changes in adhesion resulting from formation of oxidized coatings.

The present inventors have found that adhesive force is impaired when the adhesive composition proposed in Patent Literature 6 is applied for mounting of a semiconductor element with the adherend surface formed of gold.

It is therefore an object of the invention to provide an adhesive composition having sufficiently high adhesive force even when applied for mounting of a semiconductor element with an adherend surface formed of gold, as well as a semiconductor device using it.

Solution to Problem

In light of the situation described above, the invention provides an adhesive composition comprising silver particles containing silver atoms and zinc particles containing metallic zinc, wherein the silver atom content is 90 mass % or greater and the zinc atom content is from 0.01 mass % to 0.6 mass %, with respect to the total transition metal atoms in the solid portion in the adhesive composition.

The adhesive composition preferably further comprises a dispersing medium.

The adhesive composition has a Casson viscosity of preferably from 0.05 Pa·s to 2.0 Pa·s.

The mean particle diameter of the primary particles in the zinc particles is preferably from 50 nm to 150,000 nm. Also, the zinc particles are preferably flaky. The term "flaky" is a concept that includes tabular, dish and scaly shapes.

The mean particle diameter of the primary particles in the silver particles is preferably from 0.1 µm to 50 µm.

The dispersing medium preferably contains at least one compound selected from among alcohols, carboxylic acids and esters with a boiling point of 300° C. or higher. The boiling point according to the invention is the boiling point at 1 atmosphere or lower.

The volume resistivity and thermal conductivity of the cured product obtained by thermosetting the adhesive composition are preferably $1 \times 10^{-4}$ Ω·cm or lower, and 30 W/m·K or higher, respectively.

The adhesive composition is preferably cured under conditions of 100° C. to 300° C. for 5 seconds to 10 hours, more preferably 150° C. to 300° C. for 30 minutes to 5 hours, even more preferably 150° C. to 250° C. for 1 to 2 hours, and most preferably 200° C. for 1 hour.

The invention provides a semiconductor device having a structure in which a semiconductor element and semiconductor element-mounting supporting member are bonded via the adhesive composition.

Advantageous Effects of Invention

According to the invention it is possible to provide an adhesive composition having sufficiently high adhesive force even when applied for mounting of a semiconductor element with an adherend surface formed of gold, as well as a semiconductor device using it.

DESCRIPTION OF EMBODIMENTS

Figure 1:
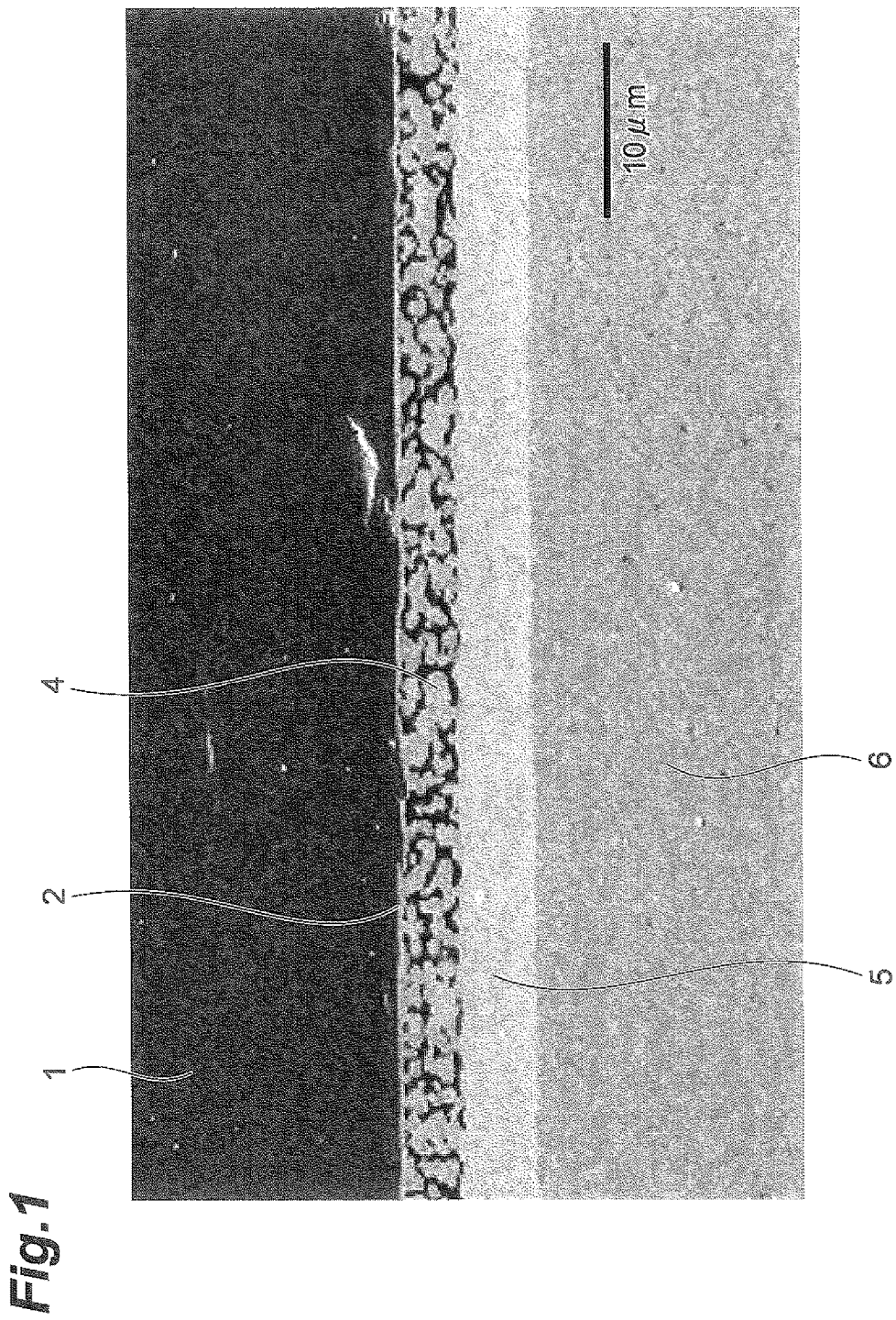
FIG. 1 is a SEM photograph at 1000 magnification, showing the results of cross-section morphology observation of the cured adhesive composition of Example 2.

As used herein, the term "step" includes not only an independent step, but also cases where it cannot be clearly distinguished from other steps, so long as the desired effect of the step can be achieved.

As used herein, a numerical range using to represents a range including the numerical values specified as the minimum and maximum values for the range.

Also, in cases where the composition contains more than one substance corresponding to each component in the composition, the references to the amounts of each of the components throughout the following description will refer to the total amounts of those substances in the composition, unless otherwise specified.

<Adhesive Composition>

The adhesive composition of this embodiment comprises silver particles and zinc particles. The adhesive composition of this embodiment may further comprise a dispersing medium.

In the adhesive composition of this embodiment, the content of silver atoms is 90 mass % or greater and more preferably 95 mass % or greater with respect to the total transition metal atoms in the solid portion. This will allow sufficient expression of high adhesive force.

In the adhesive composition of this embodiment, the content of zinc atoms is 0.01 mass % or greater, preferably 0.05 mass % or greater, more preferably 0.08 mass % or greater and even more preferably 0.1 mass % or greater, with respect to the total transition metal atoms in the solid portion. Also, in the adhesive composition of this embodiment, the content of zinc atoms is no greater than 0.6 mass % and preferably no greater than 0.5 mass %, with respect to the total transition metal atoms in the solid portion.

If the zinc atom content is within the above range, it will be possible to control maldistribution of voids near the bonding interface described hereunder, while also minimizing reduction in adhesive force due to residue of excess zinc particles after sintering, and allowing reduction in adhesive force to be prevented.

The silver atom and zinc atom contents of the adhesive composition can be measured by XRD, SEM-EDX or fluorescent X-ray measurement. Examples of methods for measuring the silver atom and zinc atom contents by SEM-EDX will now be described.

First, the adhesive composition is spread out on a dish to a thickness of no greater than 1 mm and dried with a vacuum dryer at 70° C., no greater than 100 Pa for 40 hours or longer to obtain a dry adhesive composition. The dry adhesive composition is molded to a flat thickness of at least 2 µm on a SEM sample stage, to prepare a sample for SEM. This SEM sample is subjected to quantitative analysis according to the quantitative method by SEM-EDX described hereunder, to obtain the ratio of each transition metal atom in the adhesive composition.

In addition, since the cured adhesive composition has no volatilization of the silver atoms and zinc atoms and their contents are therefore essentially unchanged, the silver atom and zinc atom contents of the cured adhesive composition may be measured as the silver atom and zinc atom contents of the adhesive composition. Specifically, the silver atom and zinc atom contents measured for the cured adhesive composition by the method described below, after coating the adhesive composition evenly onto a glass plate to a thickness of 0.1 to 0.5 mm and subjecting it to curing treatment for 1 hour at 200° C. to 300° C. in air, may be used as the adhesive composition content.

The adhesive composition of this embodiment may contain transition metal atoms other than silver atoms and zinc atoms in the solid portion, in which case their contents are, for example, preferably less than 10 mass % and more preferably less than 5 mass % with respect to the total transition metal atoms in the solid portion.

(Silver Particles)

Silver particles are particles containing silver atoms, and more preferably they are particles containing silver atoms as the main component (for example, with a silver content of 90 mass % or greater in the solid portion, same hereunder). Compositions composed mainly of silver atoms include metallic silver and silver oxide, with metallic silver being preferred.

The form of the silver particles may be spherical, mass-like, needle-like or flaky, for example. The mean particle diameter of the primary particles of the silver particles is preferably from 0.001 to 500 µm, more preferably from 0.01 µm to 100 µm and even more preferably from 0.1 µm to 50 µm.

The mean particle diameter of the primary particles of the silver particles (the volume-average particle diameter) can be measured with a laser scattering particle size distribution analyzer. An example for the measuring method will now be described.

After mixing 0.01 g of silver particles, 0.1 g of sodium dodecylbenzenesulfonate (product of Wako Pure Chemical Industries, Ltd.) and 99.9 g of distilled water (product of Wako Pure Chemical Industries, Ltd.), the mixture was treated with an ultrasonic cleaner for 5 minutes to obtain an aqueous dispersion. An LS13 320 Laser Scattering Particle Size Distribution Analyzer (product of Beckman Coulter, Inc.) mounting a Universal Liquid Module with an ultrasonic disperser unit was used, and the main power source was activated for light source stabilization and left to stand for 30 minutes. Next, distilled water was introduced into the liquid module by the Rinse command of the measuring program, and De-bubble, Measure Offset, Align and Measure Background were carried out by the measuring program. Next, "Measure Loading" was carried out by the measuring program, the aqueous dispersion was shaken, and upon reaching uniformity, a dropper was used for addition of sample to the liquid module in an amount from Low to OK in the measuring program. This was followed by "Measure" by the measuring program, and the particle size distribution was obtained. The settings used for the laser scattering particle size distribution analyzer were Pump Speed: 70%, Include PIDS data: ON, Run Length: 90 seconds, dispersing medium refractive index: 1.332, dispersoid refractive index: 0.23.

By this measurement there is usually obtained a particle size distribution having multiple peaks including a peak for aggregates other than primary particles, and one peak for the lowest particle diameter is used as the treatment range to obtain the mean particle diameter for the primary particles.

The mean particle diameter for the primary particles of the zinc particles, described hereunder, can also be measured by a similar method.

(Zinc Particles)

The zinc particles are particles comprising metallic zinc, and preferably they are particles comprising metallic zinc as the main component. For example, there may be used metallic zinc particles, zinc particles wherein the particle nuclei are metallic zinc and the surfaces have a zinc oxide layer, zinc particles wherein the particle nuclei are metallic zinc and an organic protecting coating is present, and zinc particles wherein the particle nuclei are metallic zinc and the surfaces have a metallic silver layer.

From the viewpoint of obtaining contact area with the inorganic materials of the conductive layer and substrate, the zinc particles have a mean particle diameter of the primary particles of preferably no greater than 150,000 nm, more preferably no greater than 50,000 nm and even more preferably no greater than 15,000 nm.

On the other hand, zinc readily oxidizes and the aforementioned effect cannot be obtained with zinc oxide. It is therefore preferred for the mean particle diameter of the primary particles of the zinc particles to be at least 50 nm, from the viewpoint of preventing oxidation.

The form of the zinc particles may be spherical, mass-like, needle-like or flaky, for example. From the viewpoint of dissolution in silver during sintering, a form with a large area-to-weight ratio is preferred. From the viewpoint of reducing the effect of oxidation mentioned above, flaky particles are more preferred.

(Dispersing Medium)

The dispersing medium may be either organic or inorganic, but from the viewpoint of preventing drying in the coating step, it preferably has a boiling point of 200° C. or higher, and more preferably has a boiling point of 300° C. or higher. Also, it preferably has a boiling point of no higher than 400° C. so that residue of the dispersing medium does not remain after sintering.

Furthermore, it is preferred to use as the dispersing medium one or more selected from among alcohols, carboxylic acids and esters with boiling points of 300° C. or higher, and more preferably one or more selected from among alcohols, carboxylic acids and esters with boiling points of from 300° C. to 400° C., and a volatile component with a boiling point of 100° C. or higher and below 300° C. are used in combination.

Examples of alcohols, carboxylic acids and esters with boiling points of 300° C. or higher include aliphatic carboxylic acids such as palmitic acid, stearic acid, arachidic acid, terephthalic acid and oleic acid, aromatic carboxylic acids such as pyromellitic acid and o-phenoxybenzoic acid, aliphatic alcohols such as cetyl alcohol, isobornyl cyclohexanol and tetraethylene glycol, aromatic alcohols such as p-phenylphenol, and esters such as octyl octanoate, ethyl myristate, methyl linolate, tributyl citrate and benzyl benzoate. Among these are preferred C6-20 aliphatic alcohols or carboxylic acids.

Examples of volatile components with boiling points of 100° C. or higher and below 300° C. include monohydric and polyhydric alcohols such as pentanol, hexanol, heptanol, octanol, decanol, ethylene glycol, diethylene glycol, propylene glycol, butylene glycol and α-terpineol, ethers such as ethyleneglycol butyl ether, ethyleneglycol phenyl ether, diethyleneglycol methyl ether, diethyleneglycol ethyl ether, diethyleneglycol butyl ether, diethyleneglycol isobutyl ether, diethyleneglycol hexyl ether, triethyleneglycol methyl ether, diethyleneglycol dimethyl ether, diethyleneglycol diethyl ether, diethyleneglycol dibutyl ether, diethyleneglycol butyl methyl ether, diethyleneglycol isopropyl methyl ether, triethyleneglycol dimethyl ether, triethyleneglycol butyl methyl ether, propyleneglycol propyl ether, dipropyleneglycol methyl ether, dipropyleneglycol ethyl ether, dipropyleneglycol propyl ether, dipropyleneglycol butyl ether, dipropyleneglycol dimethyl ether, tripropyleneglycol methyl ether and tripropyleneglycol dimethyl ether, esters such as ethyleneglycol ethyl ether acetate, ethyleneglycol butyl ether acetate, diethyleneglycol ethyl ether acetate, diethyleneglycol butyl ether acetate, dipropyleneglycol methyl ether acetate, ethyl lactate, butyl lactate and γ-butyrolactone, acid amides such as N-methyl-2-pyrrolidone, N,N-dimethylacetamide and N,N-dimethylformamide, aliphatic hydrocarbons such as cyclohexanone, octane, nonane, decane and undecane, aromatic hydrocarbons such as toluene and xylene, and suitable mercaptanes such as ethyl, n-propyl, i-propyl, n-butyl, i-butyl, t-butyl, pentyl, hexyl and dodecylmercaptane wherein the mercaptane contains 1 to 18 carbon atoms, or mercaptanes such as cyclopentyl, cyclohexyl and cycloheptylmercaptane wherein the cycloalkylmercaptane contains 5 to 7 carbon atoms. Of these, volatile components with boiling points of 150° C. and higher are preferred, and C4-12 alcohols, esters and ethers are more preferred.

Any of these dispersing media may be used alone, or two or more thereof may be used in admixture. The dispersing medium content is preferably 0.1 part by mass to 20 parts by mass, where the total adhesive composition is considered 100 parts by mass.

The total content of the silver particles, zinc particles and dispersing medium is preferably 90 parts by mass or greater, more preferably 95 parts by mass or greater and even more preferably 98 parts by mass or greater, where the total amount of the adhesive composition is considered 100 parts by mass.

The adhesive composition of this embodiment may further comprise one or more sintering aids, wettability improvers and antifoaming agents. The adhesive composition of this embodiment may also comprise components other than those listed here.

There may also be appropriately added to the adhesive composition of this embodiment, as necessary, humectants such as calcium oxide or magnesium oxide, wetting improvers such as nonionic surfactants and fluorine-based surfactants, antifoaming agents such as silicone oil, ion trapping agents such as inorganic ion exchangers, or polymerization inhibitors and the like.

The adhesive composition may be used as a homogeneous paste, by heating, mixing, dissolving, decoagulation kneading or dispersion of the aforementioned components as necessary, either all at once or in portions, using an appropriate combination of dispersing/dissolving apparatuses such as a stirrer, kneader, triple roll, planetary mixer or the like.

The adhesive composition preferably has a viscosity suited for different printing and coating methods, when it is to be molded, and it has a Casson viscosity of preferably 0.05 Pa·s to 2.0 Pa·s and more preferably 0.06 Pa·s to 1.0 Pa·s at 25° C.

Measurement of the Casson viscosity of the adhesive composition can be accomplished with a viscoelasticity meter (Physica MCR-501, by Anton Paar). A cone-shaped measuring jig (CP50-1) with an angle of 1° and a diameter of 50 mm is mounted, the adhesive composition is introduced into the measuring apparatus in an amount such that the adhesive composition overflows from the measuring jig at the measuring position, and measurement is conducted after scraping the overflown adhesive composition when the measuring jig has been lowered to the measuring position. The measurement is accomplished by continuously carrying out the following 2 steps at 25° C., and recording the shear rate and shearing stress in the second step. (1) Shear rate of 0 $s^{-1}$, 600 seconds, (2) shear rate of 0 to 100 $s^{-1}$, shear rate increase: 100/60 $s^{-1}$/step, measuring interval: 1 second, measuring points: 60.

From the obtained shear rate and shearing stress, the Casson viscosity was calculated by a method described in the published literature (Technical Information Institute Ca, Ltd.: rheology no sokutei to control ichimon ittou shu-rheology wo hakatte maruhadaka ni sum-, Technical Information Institute Co., Ltd., 2010, p 39-44 Specifically, the square root is calculated for each of the obtained shear rates and shearing stresses and the slope of the straight line approximated by the least square method is calculated from (shearing stress)^(½) with respect to (shear rate)^(½). The square of the slope is recorded as the Casson viscosity.

The adhesive composition may be cured, for example, by heating at 100° C. to 300° C. for 5 seconds to 10 hours. The silver atom and zinc atom contents do not change substantially before and after heating.

The silver atom and zinc atom contents of the total transition metal atoms in the cured adhesive composition can be quantified by SEM-EDX, TEM-EDX or auger electron spectroscopy of the cured adhesive composition.

An example of quantitation by SEM-EDX will now be described. A sample having a cured adhesive composition layer with a thickness of 3 μm or greater is hardened around the periphery with an epoxy cast resin. A polishing apparatus is used to shave a cross-section perpendicular to the cured adhesive composition layer, and the cross-section is smooth-finished. An antistatic layer was formed on the cross-section using a precious metal to a thickness of about 10 nm using a sputter apparatus or vapor deposition apparatus, to prepare a sample for SEM.

The SEM sample was set in a SEM-EDX (for example, an ESEM XL by Philips) and observed under a magnification of about 5,000 to 10,000×. At about the center of the cured adhesive composition, EDX point analysis was performed under conditions of sample inclination angle: 0°, acceleration voltage: 25 kV, Ev/Chan: 10, Amp, Time: 50 μS and Choose Preset: Live Time 300 secs, and quantitative analysis was performed with analysis conditions of Matrix:ZAF, SEC (Standardless Element Coefficient):EDAX and quantitation method:None, to obtain the ratio of each transition metal atom in the cured adhesive composition.

The volume resistivity of the cured adhesive composition is preferably $1 \times 10^{-4}$ Ω·cm or lower and the thermal conductivity is preferably 30 W/m·K or higher.

<Method for Manufacturing Semiconductor Device>
(Semiconductor Element and Semiconductor Element-Mounting Supporting Member)

The semiconductor element and semiconductor element-mounting supporting member of the invention are metal adherend surfaces. Metal adherend surfaces to be applied for the invention include gold, silver, copper and nickel. A plurality of the aforementioned materials may also be patterned on a substrate.

The method for producing a semiconductor device using the adhesive composition of the invention comprises at least the following steps.

(A) A step of applying the adhesive composition to a semiconductor element or semiconductor element-mounting supporting member and attaching the semiconductor element and semiconductor element-mounting supporting member (hereunder, "step (A)"), (B) A step of curing the adhesive composition to bond the semiconductor element and semiconductor element-mounting supporting member (hereunder, "step (B)").

Step (A) may also include a drying step after application of the adhesive composition.

(Step (A))—Adhesive Composition Application Step—
[Preparation of Adhesive Composition]

The adhesive composition can be prepared by mixing the aforementioned silver particles, zinc particles and optional components in a dispersing medium. Stirring may also be performed after mixing. The maximum particle diameter of the dispersion can be adjusted by filtration.

Stirring may be carried out using a stirrer. Examples of stirrers include rotating/revolving stirrers, Raikai mixers, biaxial kneaders, triple rolls, planetary mixers and thin-layer shear dispersers.

Filtration can be accomplished using a filtration device. The filter used for filtration may be, for example, a metal mesh, metal filter or nylon mesh.

[Application of Adhesive Composition]

The adhesive composition is applied onto a substrate or semiconductor element to form an adhesive composition layer. The application method may be coating or printing.

Examples of coating methods for the adhesive composition include dipping, spray coating, bar coating, die coati g, comma eating, slit coating and applicator coating.

Examples of printing methods for printing of the adhesive composition include dispenser printing, stencil printing, intaglio printing, screen printing, needle dispenser printing and jet-dispenser methods.

The adhesive composition layer formed by application of the adhesive composition may be appropriately dried, from the viewpoint of flow during curing and inhibiting void formation.

The drying method used may be drying by standing at ordinary temperature, heat drying, or reduced pressure drying. Heat drying or reduced pressure drying may employ a hot plate, warm air dryer, warm air heater, nitrogen dryer, infrared dryer, infrared heater, far-infrared heater, microwave heater, laser heater, electromagnetic heater, direct heater, steam heater or hot plate presser.

The temperature and time for drying are preferably adjusted as appropriate for the type and amount of dispersing medium used, and for example, drying is preferably carried out at 50° C. to 180° C. for 1 to 120 minutes.

After forming the adhesive composition layer, the semiconductor element and semiconductor element-mounting supporting member are attached via the adhesive composition. When a drying step is included, it may be carried out at any stage before or after the attachment step.

(Step (B))—Curing Treatment—

The adhesive composition layer is subsequently subjected to curing treatment. The curing treatment may be accomplished by heat treatment, or by hot pressing treatment. The heat treatment may employ a hot plate, warm air dryer, warm air heater, nitrogen dryer, infrared dryer, infrared heater, far-infrared heater, microwave heater, laser heater, electromagnetic heater, direct heater, steam heater, hot plate presser, or the like. Hot pressing treatment may employ a hot plate press or the like, or the aforementioned heat treatment may be carried out while pressing with a weight.

By using the method for producing an adhesive composition according to the invention, it is possible to produce a semiconductor device bonded by a cured adhesive composition with excellent adhesion, high thermal conductivity and high heat resistance of the semiconductor element and semiconductor element-mounting supporting member.

<Semiconductor Device>

The semiconductor device used may be a power module such as a diode, rectifier, thyristor, MOS gate driver, power switch, power MOSFET, IGBT, Schottky diode or fast recovery diode, or a transmitter, amplifier, LED module or the like. The power module, transmitter, amplifier or LED module obtained has high adhesion, high thermal conductivity, high conductivity and high heat resistance between the semiconductor element and semiconductor element-mounting supporting member.

Figure 9:
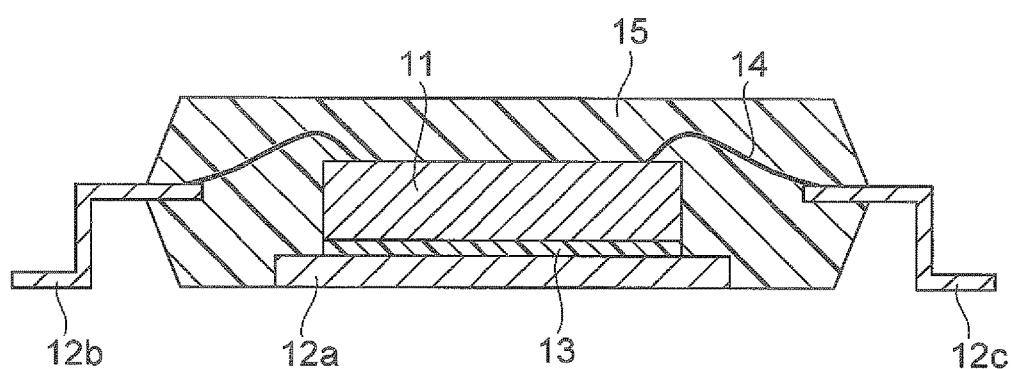
FIG. 9 is a schematic cross-sectional view showing an example of a semiconductor device according to this embodiment.

FIG. 9 is a schematic cross-sectional view showing an example of a semiconductor device produced using an adhesive composition of this embodiment. The semiconductor device shown in FIG. 9 comprises three lead frames (radiators) 12a, 12b, 12c, a chip (heating unit) 11 connected onto the lead frame 12a via an adhesive composition 13 of this embodiment, and a mold resin 15 that molds them. The chip 11 is connected to the lead frames 12b, 12c by two wires 14.

Figure 10:
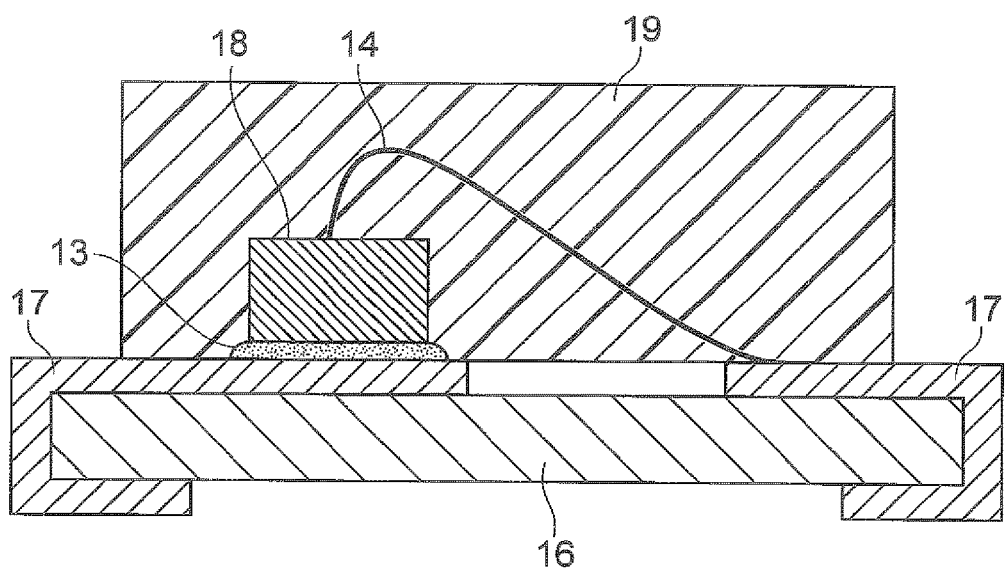
FIG. 10 is a schematic cross-sectional view showing another example of a semiconductor device according to this embodiment.

FIG. 10 is a schematic cross-sectional view showing another example of a semiconductor device produced using the adhesive composition of this embodiment. The semiconductor device shown in FIG. 10 comprises a substrate 16, two lead frames 17 formed surrounding the substrate 16, an LED chip 18 connected on the lead frame 17 via an adhesive composition 13 of this embodiment, and a translucent resin 19 sealing them. The LED chip 18 is connected to the lead frame 17 by a wire 14.

EXAMPLES

The present invention will now be explained in greater detail by examples, with the understanding that the invention is in no way limited to the examples.

Measurement of each of properties in the examples was carried out in the following manner.

(1) Mean Particle Diameter

After mixing 0.1 g of zinc particles, 0.01 g of sodium dodecylbenzenesulfonate (product of Wako Pure Chemical Industries, Ltd.) and 9.99 g of distilled water (product of Wako Pure Chemical Industries, Ltd.), the mixture was treated with an ultrasonic cleaner for 5 minutes to obtain an aqueous dispersion. An LS13 320 laser scattering particle size distribution analyzer (product of Beckman Coulter, Inc.) mounting an Universal Liquid Module with an ultrasonic disperser unit was used, and after activating the main power source f r stabilization of the light source and allowing it to stand for 30 minutes, distilled water was introduced into the liquid module by the Rinse command of the measuring program, and De-bubble, Measure Offset, Align and Measure Background of the measuring program were performed. Next, "Measure Loading" was carried out by the measuring program, the aqueous dispersion was shaken, and upon reaching uniformity, a dropper was used for addition of sample to the liquid module in an amount from Low to OK in the measuring program. This was followed by measurement by the measuring program, and the particle size distribution was obtained. The settings used for the laser scattering particle size distribution analyzer were Pump Speed: 70%, Include PIDS data: ON, Run Length: 90 seconds, dispersing medium refractive index: 1.332 and dispersoid refractive index: 0.23.

(2) Die Shear Strength

The adhesive composition was spread onto a silver plated PPF-Cu lead frame (land: 10×5 mm) using a pointed pincette, up to 0.1 mg according to a fine balance. The coated adhesive composition was plated with titanium, nickel and gold in that order, and a silicon chip with a 1×1 mm$^2$ gold plating adherend surface (gold plating thickness: 0.1 μm, chip thickness: 400 μm) was placed thereover and lightly pressed with the pincette. This was arranged in a stainless steel vat and subjected to 1 hour of treatment with a clean oven (PVHC-210, product of Tabaiespec Corp.) set to 200° C. to bond the lead frame and silicon chip with the adhesive composition.

The bonding strength of the cured adhesive composition was evaluated by the die shear strength. Using, a Universal Bond Tester (4000 Series, product of Dage) mounting a 50N load cell, a silicon chip having a gold plating adherend surface was pressed in the horizontal direction at a measuring speed of 500 μm/s and a measuring height of 100 μm, and the die shear strength of the cured adhesive composition was measured. The average of 12 measurements was recorded as the die shear strength.

(3) Thermal Conductivity

The adhesive composition was subjected to heat treatment at 200° C. for 1 hour using a clean oven (PVHC-210 by Tabaiespec Corp.), to obtain a 10 mm×10 mm×1 mm cured adhesive composition. The thermal diffusivity of this cured adhesive composition was measured by the laser flash method (LFA 447 by Netzsch, 25° C.). The coefficient of thermal conductivity (W/m·K) of the cured adhesive composition at 25° C. was calculated from this thermal diffusivity and the product of the specific heat capacity obtained with a differential scanning calorimeter (Pyris1 by Perkin-Elmer) and the specific gravity obtained by Archimedes' method.

(4) Volume Resistivity

Two strips of Mylar tape (product of Nitto Denko Corp.) with 50 mm lengths were affixed on the glass plate at a spacing of about 1 mm, and a squeegee was used for coating of the adhesive composition in the gaps between the Mylar tapes.

The adhesive composition was subjected to heat treatment at 200° C. for 1 hour using a clean oven (PVHC-210 by Tabaiespec Corp.), to obtain a 1×50×0.03 mm cured adhesive composition on the glass plate. A constant current power source (Model 5964 by Metronix) was used to apply a 1 mA current between both edges of the cured adhesive composition, and a needle probe connected to a multimeter (R687E DIGITAL MULTIMETER by Advantest Corp.) was contacted with the cured adhesive composition at an interval of 10 mm for measurement of the voltage. The film thickness of the cured adhesive composition was measured as the difference between the thickness of a glass substrate and the total thickness of the glass substrate and the cured adhesive composition, using a Digital Linear Gauge (DG-525H, product of Ono Sokki Co., Ltd.), and the average of 4 points was recorded as the thickness of the cured adhesive composition. The width of the cured adhesive composition was measured using an optical microscope measuring device (Measurescope UM-2, product of Nikon Corp.), and the average of 4 points was recorded as the width of the cured adhesive composition. The voltage, current (1 mA), voltage measuring interval (10 mm), film thickness and width of the cured adhesive composition were inserted into the following formula (1) of the four-terminal method to determine the volume resistivity. The measurement was carried out at 4 different locations of the cured adhesive composition, and the average value was recorded as the volume resistivity of the cured adhesive composition.

[Formula 1]

$$\text{Volume resistivity} = (\text{Voltage}/\text{current}) \times (\text{Width} \times \text{thickness}/\text{voltage measuring interval}) \quad (1)$$

(5) Cross-Section Morphology Observation

A sample of a chip and substrate bonded with an adhesive composition was anchored in a cup with a sample clip (Samplklip I, product of Buehler) and an epoxy casting resin (EPOMOUNT, product of Refine Tee Ltd.) was cast around it to encompass the entire sample, after which it was allowed to stand in a vacuum desiccator with reduced pressure for 1 minute for defoaming. The epoxy casting resin was then cured for 2 hours with a thermostatic device at 60° C.

It was shaved to the adhesive section using a polishing apparatus (Refine Polisher HV, product of Refine Tec Ltd.) fitted with waterproof abrasive paper (CARBO MAC PAPER, product of Refine Tec Ltd.), to expose the cross-section. Next, the cross-section was smoothly finished using a polishing apparatus setting a buffing cloth soaked with a buffing agent. A sputter device (ION SPUTTER, product of Hitachi High-Technologies Corp.) was used for sputtering of Pt on the cross-section to a thickness of 10 nm, to obtain a sample for SEM. The SEM sample was set in a SEM apparatus (ESEM XL30 by Philips) to observe the cross-section of the cured adhesive composition at 1000× magnification with an application voltage of 10 kV.

Examples 1 to 4, Comparative Examples 1 to 3

Preparation of Adhesive Composition

Upon mixing isobomylcyclohexanol (TERSOLVE MTPH, product of Nippon Terpene Chemicals, Inc.) and dipropyleneglycol methyl ether acetate (DPMA, product of Dicel Chemical Industries, Ltd.) as dispersing media and stearic acid (New Japan Chemical Co., Ltd.) as a particle surface treatment agent in a plastic bottle, it was tightly stoppered and warmed in a water bath at 50° C. and occasionally stirred to obtain a transparent homogeneous solution. To this solution there were added scaly zinc particles (Product No.: 13789, Alfa Aesar, product of A Johnson Matthey Company) as zinc particles and scaly silver particles (AGC239, product of Fukuda Metal Foil & Powder Co., Ltd.) and spherical silver particles (K-0082P, product of Metalor) as silver particles, and the mixture was stirred with a spatula until the dry powder disappeared. It was then tightly stoppered and a rotating/revolving stirrer (Planetary Vacuum Mixer ARV-310, product of Thinky, Inc.) was used for stirring at 2000 rpm for 1 minute to obtain an adhesive composition. The amount of addition of each component during this time was as shown in Table 1.

The mean particle diameter of the scaly zinc particles was 23 μm, the mean particle diameter of the scaly silver particles was 5.42 μm, and the mean particle diameter of the spherical silver particles was 1.64 μm.

The adhesive compositions of Example 2 and Comparative Example 3 were used to obtain samples by bonding lead frames and silicon chips with the adhesive compositions, by the method described under "(2) Die shear strength". The samples were subjected to cross-section morphology observation by the method described under "(5) Cross-section morphology observation". FIG. 1 is a SEM photograph at 1000× magnification, showing the results of cross-section morphology observation of the cured adhesive composition of Example 2, and FIG. 2 and FIG. 3 are SEM photographs at 1000× and 5000× magnification, respectively, showing the results of cross-section morphology observation of the cured adhesive composition of Comparative Example 2.

Figure 2:
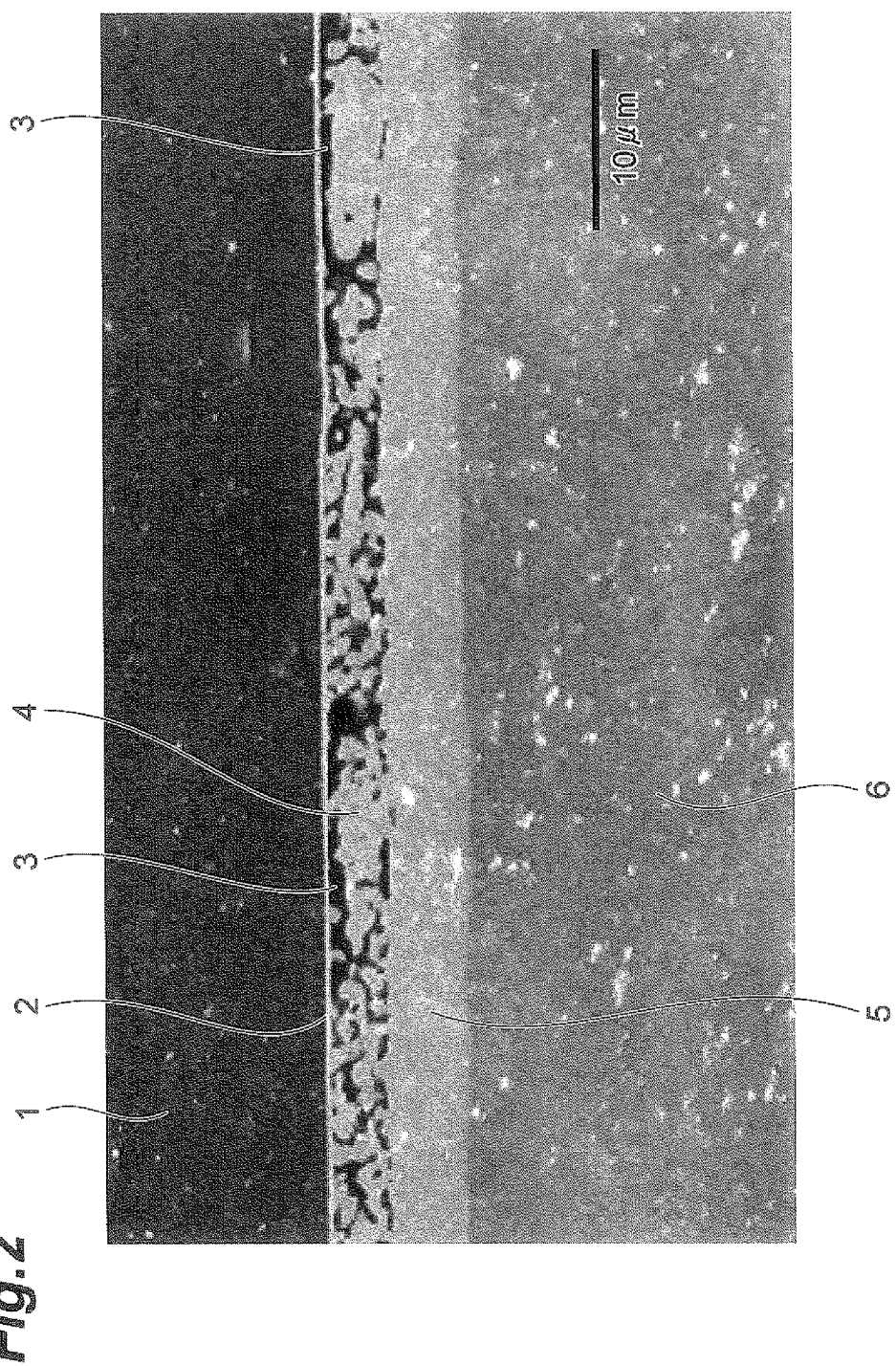
FIG. 2 is a SEM photograph at 1000 magnification, showing the results of cross-section morphology observation of the cured adhesive composition of Comparative Example 2.
Figure 3:
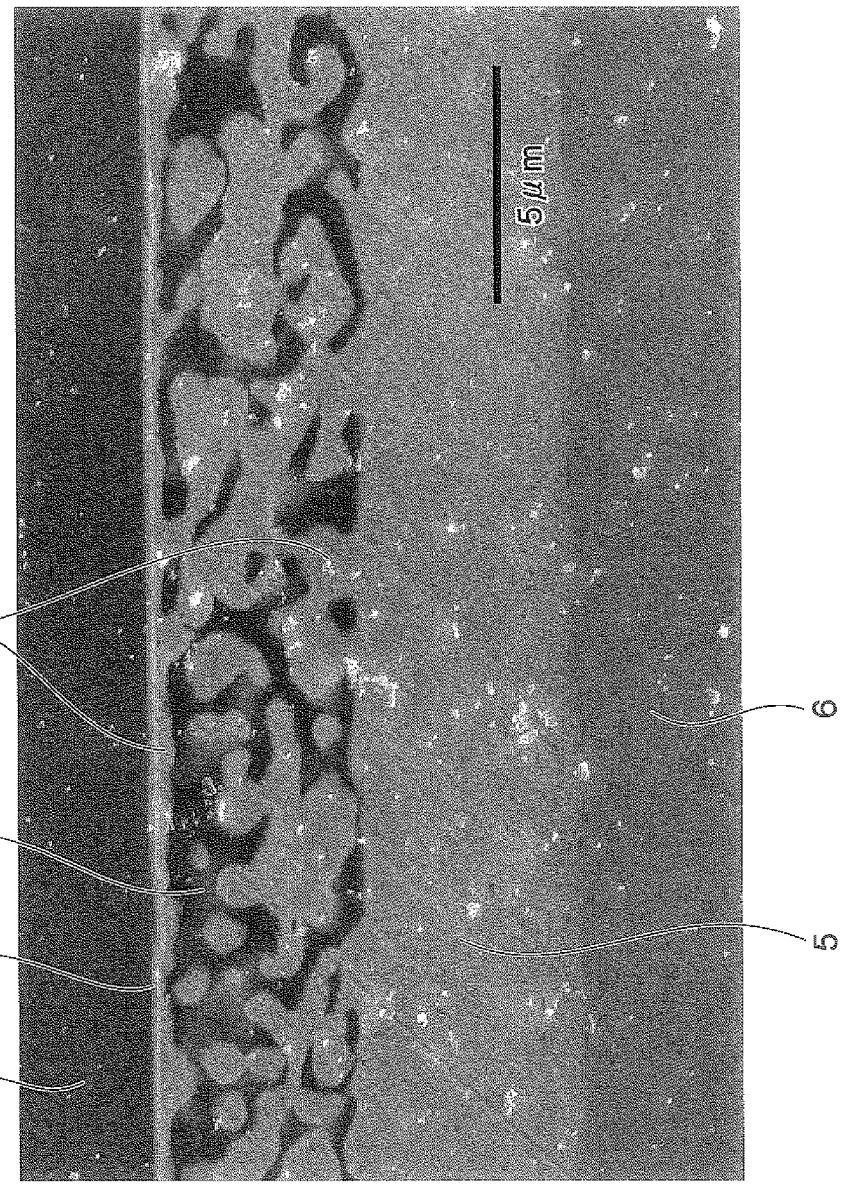
FIG. 3 is a SEM photograph at 5000 magnification, showing the results of cross-section morphology observation of the cured adhesive composition of Comparative Example 2.

The numerals in FIGS. 1 to 3 represent the following: 1: silicon chip, 2: plating layer, 3: voids generated near interface between gold plating layer and cured adhesive composition, 4: cured adhesive composition, 5: silver plating layer of silver-plated PPF-Cu lead frame, 6: copper layer of silver-plated PPF-Cu lead frame, 7: zinc particles. These numerals are the same for FIGS. 4 to 7 as well.

As clearly seen from FIG. 1, using the adhesive composition of Example 2 resulted in uniformly distributed voids produced by sintering in the cured adhesive composition 4, and no bias of the voids was seen. On the other hand, as seen from FIG. 2 and FIG. 3, using the adhesive composition of Comparative Example 3 resulted in maldistribution of numerous voids near the bonding interface with the gold plating layer, and this was attributed to reduction in adhesive force.

Figure 4:
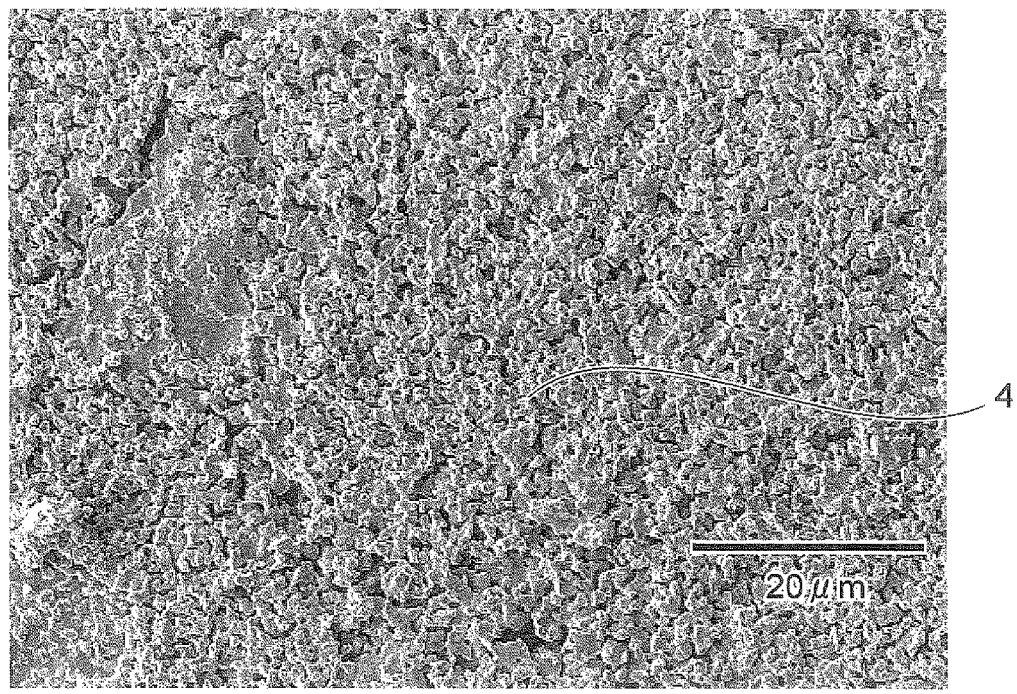
FIG. 4 is a SEM photograph at 1000 magnification, showing fracture on the substrate side after the die shear strength test in Example 2.
Figure 5:
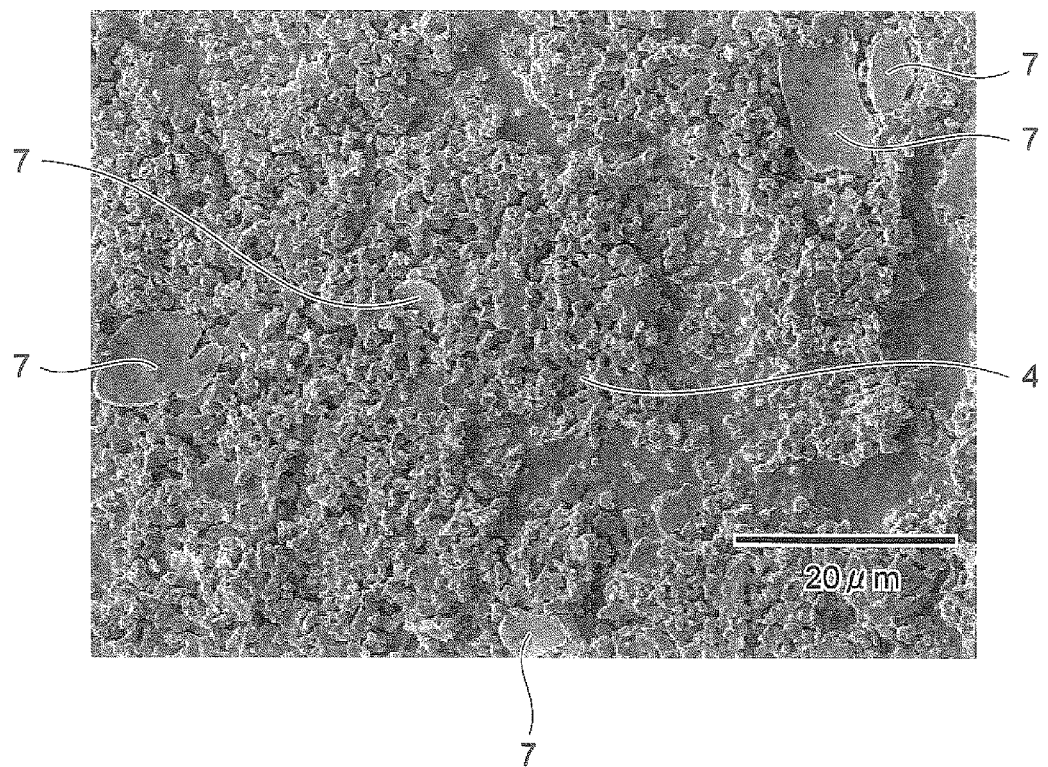
FIG. 5 is a SEM photograph at 1000 magnification, showing fracture on the substrate side after the die shear strength test in Comparative Example 1.

The adhesive compositions of Example 2 and Comparative Example 1 were observed at 1000× magnification on the fracture surface on the substrate side after die shear strength testing. FIG. 4 is a SEM photograph at 1000× magnification, showing the fracture surface on the substrate side after die shear strength testing for Example 2, and FIG. 5 is a SEM photograph at 1000× magnification, showing the fracture surface on the substrate side after die shear strength testing for Comparative Example 1.

As clearly shown by FIG. 4, using the adhesive composition of Example 2 resulted in observation of only meshdike sintered metal, and no observation of the added scaly zinc particles. This was attributed to dissolution of the zinc particles into the cured adhesive composition 4. As clearly seen from FIG. 5, on the other hand, using the adhesive compositions of the comparative examples resulted in observation of scaly zinc particles 7 in the sintered metal.

These scaly zinc particles 7 were the remainder of some of the added zinc particles that failed to dissolve into the cured adhesive composition 4, and they appeared to have not bonded with the surrounding metal. Presumably, the adhesive force was lowered by infiltration of such particles.

TABLE 1

|  |  | Comp. Example 1 | Example 1 | Example 2 | Example 3 | Example 4 | Comp. Example 2 | Comp. Example 3 |
|---|---|---|---|---|---|---|---|---|
| Adhesive composition | Zinc particles (g) | 0.176 | 0.088 | 0.0176 | 0.0088 | 0.0018 | 0.0002 | 0 |
|  | Ratio with respect to total transition metal elements (mass %) | 1 | 0.5 | 0.1 | 0.05 | 0.01 | 0.001 | 0 |
|  | Silver particles — Scaly silver particles | 8.712 | 8.756 | 8.791 | 8.796 | 8.799 | 8.800 | 8.800 |
|  | Silver particles — Spherical silver particles (g) | 8.712 | 8.856 | 8.791 | 8.796 | 8.799 | 8.800 | 8.800 |
|  | Dispersing medium — Stearic acid (g) | 0.176 | 0.176 | 0.176 | 0.176 | 0.176 | 0.176 | 0.176 |
|  | Dispersing medium — MTPH (g) | 1.112 | 1.112 | 1.112 | 1.112 | 1.112 | 1.112 | 1.112 |
|  | Dispersing medium — DPMA (g) | 1.112 | 1.112 | 1.112 | 1.112 | 1.112 | 1.112 | 1.112 |
|  | Casson viscosity (Pa · s) | 0.19 | 0.26 | 0.95 | 0.24 | 0.19 | 0.21 | 0.23 |
| Cured product | Die shear strength (MPa) | 16 | 24 | 23 | 19 | 18 | 17 | 17 |
|  | Volume resistivity ($\times 10^{-8}$ Ω · m) | 6.2 | 6.2 | 5.9 | 5.7 | 5.6 | 5.6 | 5.6 |
|  | Thermal conductivity | — | — | 109 | — | — | — | — |

Examples 5 and 6

Preparation of Adhesive Composition

Upon mixing 1.112 g of isobotnylcyclohexanol, 1.112 g of dipropyleneglycol methyl ether acetate and 0.132 g of stearic acid in a plastic bottle, it was tightly stoppered and warmed in a water bath at 50° C. with occasional shaking, to obtain a transparent homogeneous solution. To this solution there were added 0.0176 g of zinc particles (0.1 mass % with respect to the total transition metal element in the solid portion), 8.791 g of scaly silver particles and 8.791 g of spherical silver particles, the mixture was stirred with a spatula until the dry powder disappeared, and the bottle was tightly stoppered and stirred with a rotating/revolving stirrer at 2000 rpm for 1 minute to obtain an adhesive composition. The zinc particles used were those listed in Table 2, while the other starting materials were the same as those used in Example 1.

Comparative Examples 4 to 9

Adhesive compositions were obtained in the same manner as Examples 5 and 6, except that the added particles listed in Table 3 were used instead of zinc particles.

TABLE 2

|  |  | Example 5 | Example 6 |
|---|---|---|---|
| Zinc particles | Shape | Spherical | Spherical |
|  | BET specific surface area (m²/g) | 40 | 0.08 |
|  | Model (Manufacturer) | 578002 (Sigma Aldrich) | ZNE01PB (Kojundo Chemical) |
| Casson viscosity (Pa · s) | | 0.22 | 0.34 |
| Die shear strength (MPa) | | 19 | 18 |
| Volume resistivity ($\times 10^{-8}$ Ω · m) | | 5.6 | 6.0 |

TABLE 3

|  |  | Comp. Example 4 | Comp. Example 5 | Comp. Example 6 | Comp. Example 7 | Comp. Example 8 | Comp. Example 9 |
|---|---|---|---|---|---|---|---|
| Added particles | Material | Zinc oxide | Sn | In | Red phosphorus | Ni | Zinc stearate |
|  | Shape | Spherical | Spherical | Amorphous | Powdery | Flaky | Powdery |
|  | Model (Manufacturer) | Nanotech ZnO (CIK Nanotech) | 576883, Sigma Aldrich | Sigma Aldrich | 169-02241, Wako Pure Chemical | Nikko Rica | 269-01672, Wako Pure Chemical |

TABLE 3-continued

|  | Comp. Example 4 | Comp. Example 5 | Comp. Example 6 | Comp. Example 7 | Comp. Example 8 | Comp. Example 9 |
|---|---|---|---|---|---|---|
| Casson viscosity (Pa · s) | — | 0.21 | 0.11 | 0.18 | 0.46 | 0.43 |
| Die shear strength (MPa) | 12 | 17 | 17 | 12 | 17 | 17 |
| Volume resistivity ($\times 10^{-8}$ $\Omega \cdot$ m) | No conduction | 7.0 | 5.8 | 5.5 | 4.8 | 6.5 |

Example 7

Preparation of Adhesive Composition

An adhesive composition was prepared in the same manner as Example 2.

Thermocompression Bonding of Chip and Substrate

The adhesive composition was stencil printed onto a copper sheet-attached alumina substrate having a silver plating on the copper electrode surface of the alumina substrate, using a stainless steel sheet having a 10 mm×10 mm square opening. Titanium, nickel and gold were plated in this order on the printed adhesive composition, and after placing a silicon chip with a 1×1 mm² gold plating adherend surface (gold plating thickness: 0.1 µm, chip thickness: 400 µm) over it, it was treated for 30 minutes in a clean oven set to 90° C., after which it was subjected to thermocompression bonding in a thermocompression bonding test apparatus (product of Tester Sangyo Co., Ltd.) for 10 minutes at 300° C., 10 MPa, to b rid the substrate and chip with the adhesive composition.

Figure 6:
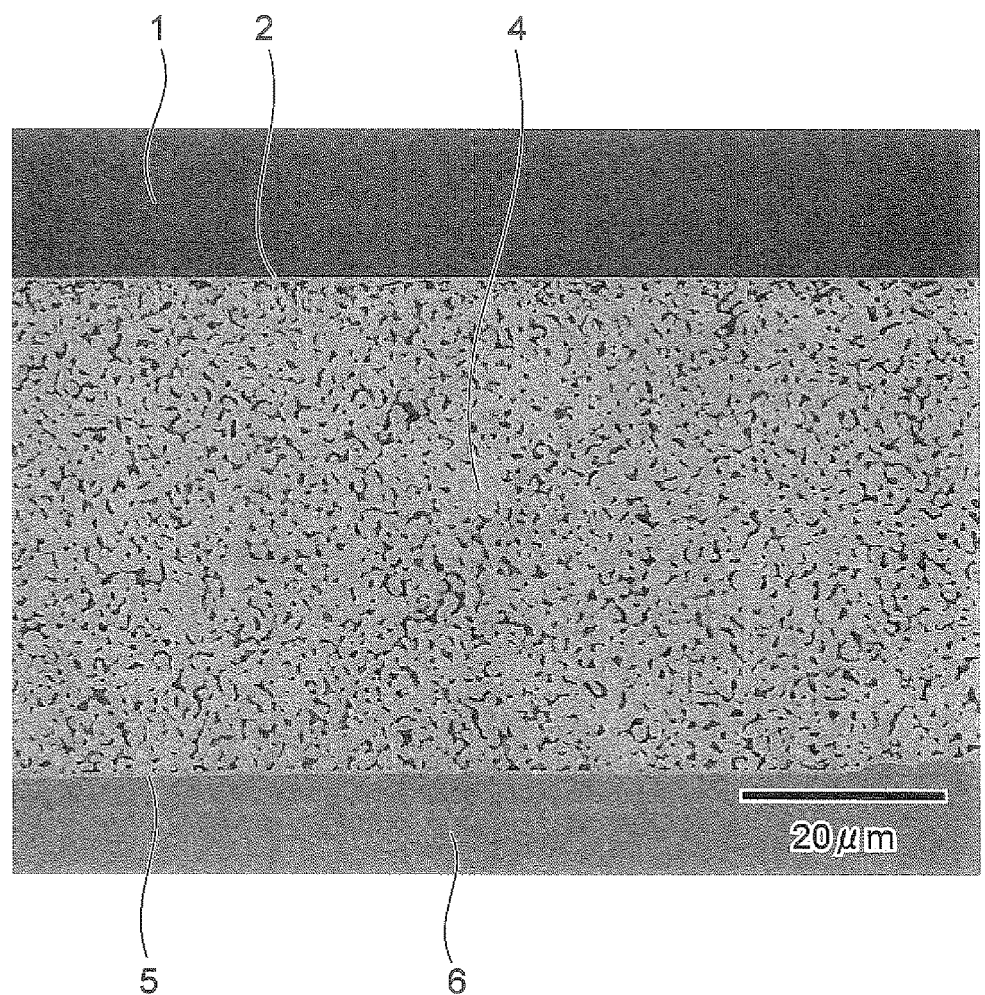
FIG. 6 is a SEM photograph at 1000 magnification, showing the results of cross-section morphology observation of the cured adhesive composition of Example 7.

The obtained sample was subjected to cross-section morphology observation by the method described under "(5) Cross-section morphology observation". FIG. 6 is a SEM photograph at 1000 magnification, showing the results of cross-section morphology observation of the cured adhesive composition of Example 7. As clearly seen from FIG. 6, using the cured adhesive composition of Example 7 resulted in uniformly distributed voids produced by sintering in the cured adhesive composition 4, and no bias of the voids was seen.

Comparative Example 10

Preparation of Adhesive Composition

Figure 7:
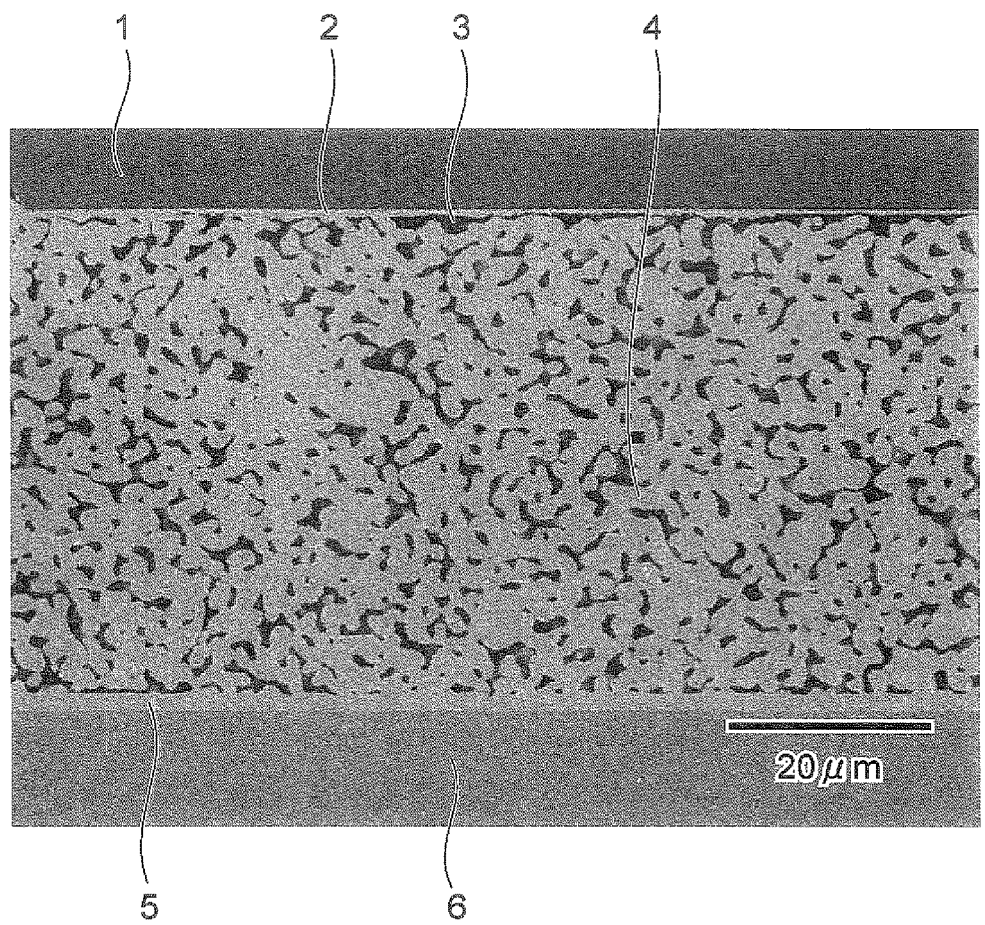
FIG. 7 is a SEM photograph at 1000 magnification, showing the results of cross-section morphology observation of the cured adhesive composition of Comparative Example 10.

Upon mixing 1.370 g of isobornylcyclohexanol, 1.370 g of dipropyleneglycol methyl ether acetate and 0.270 g of stearic acid in a plastic bottle, it was tightly stoppered and warmed in a water bath at 50° C., with occasional shaking to obtain a transparent homogeneous solution. To this solution there was added 27 g of scaly silver particles, the mixture was stirred with a spatula until the dry powder disappeared, and the bottle was tightly stoppered and stirred with a rotating/revolving stirrer at 2000 rpm for 1 minute to obtain an adhesive composition. (Thermocompression bonding of chip and substrate) The obtained adhesive composition was subjected to thermocompression bonding of the chip and substrate in the same manner as Example 7, and the obtained sample was subjected to cross-section morphology observation by the method described under "(5) Cross-section morphology observation". FIG. 7 is a SEM photograph at 1000 magnification, showing the results of cross-section morphology observation of the cured adhesive composition of Comparative Example 10. As clearly seen from FIG. 7, the cured adhesive composition of Comparative Example 10 had more numerous voids 3 maldistributed near the bonding interface with the gold plating layer, compared to the other sections.

Example 8

An adhesive composition was prepared in the same manner as Example 1, and three groups of die shear strength samples were prepared, with 12 samples per group. The three groups of die shear strength samples were held on a hot plate heated to 200° C. for 2, 5 and 10 hours, respectively, for heat treatment. The die shear strength of the heat treated die shear strength samples was measured after restoring them to room temperature. The results are shown in FIG. 8.

Comparative Example 11

Die shear strength samples were prepared by the same method as Example 8, except for using an adhesive composition prepared in the same manner as Comparative Example 1, and the die shear strength was measured. The results are shown in FIG. 8.

Figure 8:
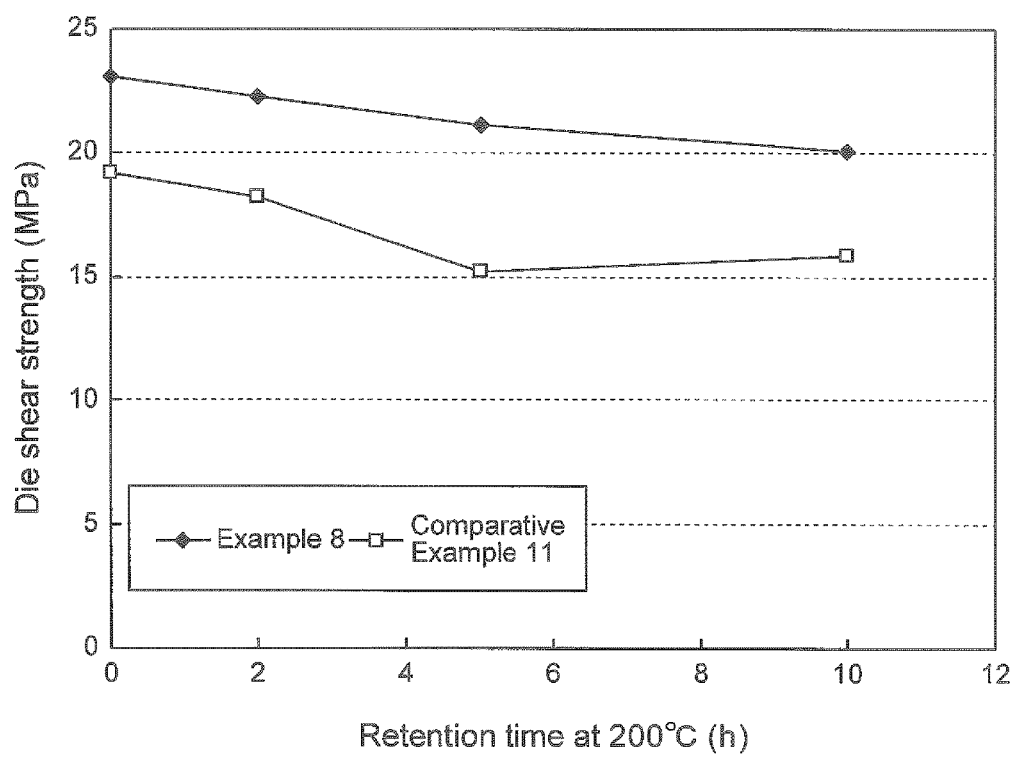
FIG. 8 is graph showing the results of measuring the die shear strengths of die shear strength samples prepared using the adhesive compositions of Example 8 and Comparative Example 11.

As clearly seen from FIG. 8, the reduction in die shear strength after being held at 200° C. was lower in Example 8 than in Comparative Example 11, and therefore adhesion could be maintained at high temperature.

REFERENCE SIGNS LIST

1: Silicon chip, 2: plating layer, 3: void produced near interface between gold plating layer and cured adhesive composition, 4: cured adhesive composition, 5: silver plating layer of silver plated PPF-Cu lead frame, 6: copper layer of silver plated PPF-Cu lead frame, 7: zinc particle.

The invention claimed is:

1. A semiconductor device having a structure in which a semiconductor element and a semiconductor element-mounting supporting member are bonded via an adhesive composition, wherein the semiconductor element is a power module, transmitter, amplifier, or LED module,
   wherein, before curing, the adhesive composition comprising silver particles containing silver atoms and zinc particles containing metallic zinc,
   wherein the silver atom content is 90 mass % or greater and the zinc atom content is from 0.01 mass % to 0.6 mass %, with respect to the total transition metal atoms in the adhesive composition.

2. The semiconductor device according to claim 1, wherein, before curing, the mean particle diameter of the primary particles of the zinc particles is from 50 nm to 150,000 nm.

3. The semiconductor device according to claim 1, wherein, before curing, the zinc particles are flaky.

4. The semiconductor device according to claim 1, wherein, before curing, the mean particle diameter of the primary particles of the silver particles is from 0.1 µm to 50 µm.

5. The semiconductor device according to claim 1, wherein an adherend surface of the semiconductor element is formed of gold.

6. The semiconductor device according to claim 1, wherein the silver atom content is 95 mass % or greater.

7. The semiconductor device according to claim 1, wherein the zinc atom content is from 0.05 mass % to 0.6 mass %, with respect to the total transition metal atoms in the adhesive composition.

8. The semiconductor device according to claim 1, wherein the zinc atom content is from 0.08 mass % to 0.6 mass %, with respect to the total transition metal atoms in the adhesive composition.

9. The semiconductor device according to claim 1, wherein the zinc atom content is from 0.1 mass % to 0.6 mass %, with respect to the total transition metal atoms in the adhesive composition.

10. The semiconductor device according to claim 1, wherein the zinc atom content is from 0.1 mass % to 0.5 mass %, with respect to the total transition metal atoms in the adhesive composition.

11. The semiconductor device according to claim 1, wherein the adhesive composition bonding the semiconductor element and the semiconductor element-mounting supporting member is cured to provide a sintered metal having distributed voids.

12. A semiconductor device having a structure in which a semiconductor element and a semiconductor element-mounting supporting member are bonded via an adhesive composition,
wherein, before curing, the adhesive composition comprising silver particles containing silver atoms and zinc particles containing metallic zinc, the form of the zinc particles being mass-like, needle-like or flaky,
wherein the silver atom content is 90 mass % or greater and the zinc atom content is from 0.01 mass % to 0.6 mass %, with respect to the total transition metal atoms in the adhesive composition.

13. The semiconductor device according to claim 12, wherein, before curing, the adhesive composition further comprises a dispersing medium.

14. The semiconductor device according to claim 13, wherein the dispersing medium contains at least one compound selected from among alcohols, carboxylic acids and esters with a boiling point of 300° C. or higher.

15. The semiconductor device according to claim 12, wherein, before curing, the adhesive composition has a Casson viscosity from 0.05 Pa·s to 2.0 Pa·s.

16. The semiconductor device according to claim 12, wherein, before curing, the mean particle diameter of the primary particles of the zinc particles is from 50 nm to 150,000 nm.

17. The semiconductor device according to claim 12, wherein, before curing, the zinc particles are flaky.

18. The semiconductor device according to claim 12, wherein, before curing, the mean particle diameter of the primary particles of the silver particles is from 0.1 µm to 50 µm.

19. The semiconductor device according to claim 12, wherein the volume resistivity and thermal conductivity of a cured product obtained by thermosetting the adhesive composition are $1\times10^{-4}$ Ω·cm or lower and 30 W/m·K or higher, respectively.

20. The semiconductor device according to claim 12, wherein the adhesive composition bonding the semiconductor element and the semiconductor element-mounting supporting member is cured to provide a sintered metal having distributed voids.

* * * * *